(12) United States Patent
Jaffari

(10) Patent No.: US 9,094,077 B2
(45) Date of Patent: Jul. 28, 2015

(54) SLOPE DETECTING RECEIVER

(71) Applicant: Nasrin Jaffari, Sunnyvale, CA (US)

(72) Inventor: Nasrin Jaffari, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/961,767

(22) Filed: Aug. 7, 2013

(65) Prior Publication Data

US 2014/0294129 A1    Oct. 2, 2014

Related U.S. Application Data

(60) Provisional application No. 61/807,667, filed on Apr. 2, 2013.

(51) Int. Cl.
| | | |
|---|---|---|
| H04B 3/00 | (2006.01) | |
| H04L 27/00 | (2006.01) | |
| H04B 1/10 | (2006.01) | |
| H03M 5/06 | (2006.01) | |
| H03M 5/12 | (2006.01) | |

(52) U.S. Cl.
CPC . *H04B 1/10* (2013.01); *H03M 5/06* (2013.01); *H03M 5/12* (2013.01)

(58) Field of Classification Search
CPC ................................ H03K 5/08; H04B 10/695
USPC .................................................. 375/257, 316
See application file for complete search history.

(56) References Cited

U.S. PATENT DOCUMENTS

| | | | |
|---|---|---|---|
| 4,369,465 A * | 1/1983 | Blamoutier et al. .......... 348/618 |
| 4,876,615 A | 10/1989 | Chikashige | |
| 5,007,069 A * | 4/1991 | VanEss .......................... 375/324 |
| 7,612,600 B2 * | 11/2009 | Liu et al. ....................... 327/307 |
| 2006/0022855 A1 * | 2/2006 | Motz et al. .................... 341/143 |
| 2007/0222430 A1 * | 9/2007 | Sullivan et al. ............ 324/76.15 |

FOREIGN PATENT DOCUMENTS

| | | |
|---|---|---|
| EP | 0 674 393 A1 | 9/1995 |
| KR | 10-2006-0094225 | 8/2006 |
| KR | 10-2006-0125092 | 12/2006 |

OTHER PUBLICATIONS

Blahut, Richard E.; Modem Theory, An Introduction to Telecommunications; 2010, Cambridge University Press No. XP002726326, pp. 45-46.

(Continued)

*Primary Examiner* — Don N Vo
(74) *Attorney, Agent, or Firm* — Christie, Parker & Hale, LLP

(57) ABSTRACT

A receiver for receiving digital data after transmission through a channel which produces inter-symbol interference or other distortion. In one embodiment, a received signal is differentiated before being digitized to form an output digital bit stream, to reduce the effects of inter-symbol interference and other distortion in the channel. The differentiated signal is compared to two threshold values, a first threshold value, and a second threshold value, the first threshold value being greater than the second threshold value. When the differentiated signal exceeds the first threshold, the output bit is 1, when the differentiated signal is less than the second threshold value, the output bit is 0, and when the differentiated signal is between the first threshold value and the second threshold value, the output bit is the same as the previous output bit.

6 Claims, 9 Drawing Sheets

(56) References Cited

OTHER PUBLICATIONS

European Search Report; Application Serial No. 14163276.0-1903; dated Jul. 14, 2014; 7 pages.

\* cited by examiner

SLOPE DETECTING RECEIVER

CROSS-REFERENCE TO RELATED APPLICATION(S)

This application claims priority to and the benefit of Provisional Application No. 61/807,667, filed Apr. 2, 2013, entitled "SLOPE DETECTING RECEIVER", the entire content of which is incorporated herein by reference.

FIELD

One or more aspects of embodiments according to the present invention relate to digital data transmission and more particularly to a system and method for improved data transmission through an imperfect channel, such as a channel producing inter-symbol interference.

BACKGROUND

Digital data transmission across an analog channel is used in displays, servers, data storage, and wireless internet, and may be performed using various modulation schemes, in which an analog signal is modulated according to the data content, i.e., bits of a digital data stream, to be transmitted across the channel. For example, the modulation may involve non-return-to-zero (NRZ) coding.

Referring to FIG. 1, in a conventional receiver, the input c(t) from the channel is, at each unit interval (UI), compared, in an act 110, to a reference signal voltage or threshold value value $V_{th}$. If the input exceeds the threshold value $V_{th}$, then the data value d(n) at the current unit interval is set, in an act 115, to 1; otherwise it is set, in an act 120, to 0. Referring to FIG. 2, a well-formed data waveform 210 modulated using NRZ coding with the binary pattern '1100', results, in the sampled waveform 215, in two samples P1, P2 exceeding the threshold value and two samples P3, P4 below the threshold value, which results, at the output of the comparator 220, in a digital output stream 225 having two ones followed by two zeros.

Referring to FIG. 3, after an NRZ waveform representing the bit stream '0001011111101000', preceded and followed by some number of zeroes, is transmitted through a channel producing inter-symbol interference or otherwise distorting the transmitted waveform, the received waveform 310 may appear as illustrated and may lack sharp transitions between levels corresponding to 0 and 1, as, for example, illustrated in FIG. 2 for the well-formed waveform 210. Referring to FIG. 4, this may result in errors at, for example, the points in the received waveform circled with dashed lines. Thus, there is a need for a system and method for receiving, e.g., converting to a digital bit stream, a signal received at the output of an imperfect channel.

The above information disclosed in this Background section is only for enhancement of understanding of the background of the invention and therefore it may contain information that does not form the prior art that is already known in this country to a person of ordinary skill in the art.

SUMMARY

According to aspects of embodiments of the present invention, a received signal is differentiated before being digitized to form an output digital bit stream, to reduce the effects of inter-symbol interference and other distortion in the channel. The differentiated signal is compared to two threshold values, a first threshold value, and a second threshold value, the first threshold value being greater than the second threshold value. When the differentiated signal exceeds the first threshold, the output bit is 1, when the differentiated signal is less than the second threshold value, the output bit is 0, and when the differentiated signal is between the first threshold value and the second threshold value, the output bit is the same as the previous output bit.

According to an embodiment of the present invention there is provided a receiver for generating a binary data stream from a modulated analog signal, the receiver including: a differentiator; a first comparator; a second comparator; and a digital circuit, an input of the differentiator configured to receive the analog signal, an output of the differentiator connected to a non-inverting input of the first comparator, an inverting input of the first comparator configured to receive a first threshold value, the output of the differentiator connected to an inverting input of the second comparator, a non-inverting input of the second comparator configured to receive a second threshold value, an output of each of the first and second comparators connected to an input of the digital circuit, and the digital circuit configured to generate the binary data stream.

In one embodiment, the first threshold value is greater than zero; and the second threshold value is less than zero.

In one embodiment, the digital circuit is configured to output: a value of 1 when the output of the first comparator is 1; a value of 0 when the value of the second comparator is 1; and an unchanging value otherwise.

In one embodiment, the receiver includes a first input, a second input, a third input, and an output; a two-input OR gate, including a first input, a second input, and an output; a delay block including an input and an output, configured to introduce a signal delay of one unit interval; and an inverter including an input and an output; the output of the first comparator being connected to the first input of the three-input NOR gate and to the first input of the two-input OR gate, the output of the second comparator being connected to the second input of the three-input NOR gate, the output of the three-input NOR gate being connected to the second input of the two-input OR gate, the output of the two-input OR gate being connected to the input of the delay block, the output of the delay block being connected to the input of the inverter, the output of the inverter being connected to the third input of the three-input NOR gate, and the output of the two-input OR gate being connected to the output of the digital circuit.

According to an embodiment of the present invention there is provided a method of generating, in a receiver, a binary data stream from a modulated analog signal, the method including: differentiating the analog signal to form a differentiated signal; comparing the differentiated signal to a first threshold value; comparing the differentiated signal to a second threshold value; forming a binary output of 1 at an output of the receiver when the differentiated signal exceeds the first threshold value; forming a binary output of 0 at the output of the receiver when the differentiated signal is less than the second threshold value; and leaving the binary output unchanged when the differentiated signal is less than the first threshold value and greater than the second threshold value.

In one embodiment, the acts of: forming a binary output of 1 at an output of the receiver when the differentiated signal exceeds the first threshold value; forming a binary output of 0 at the output of the receiver when the differentiated signal is less than the second threshold value; and leaving the binary output unchanged when the differentiated signal is less than the first threshold value and greater than the second threshold value include: comparing the differentiated signal to the first threshold value in a first comparator, to form a first binary result which takes the value 1 when the differentiated signal exceeds the first threshold value and which takes the value 0 when the differentiated signal is less than the first threshold value; comparing the differentiated signal to the second threshold value in a second comparator, to form a second binary result which takes the value 1 when the differentiated signal is less than the second threshold value and which takes the value 0 when the differentiated signal exceeds the second threshold value; combining the first binary result, the second binary result, and a third binary result in a three-input NOR gate to form a fourth binary result; combining the fourth binary result and the first binary result in a two-input OR gate to form a fifth binary result; delaying the fifth binary result by a unit interval and inverting it to form the third binary result; and providing the fifth binary result at the output of the receiver.

According to an embodiment of the present invention there is provided a system for generating, in a receiver, a binary data stream from a modulated analog signal, the system including: means for differentiating the analog signal to form a differentiated signal; means for comparing the differentiated signal to a first threshold value; means for comparing the differentiated signal to a second threshold value; means for forming a binary output of 1 at an output of the receiver when the differentiated signal exceeds the first threshold value; means for forming a binary output of 0 at the output of the receiver when the differentiated signal is less than the second threshold value; and means for leaving the binary output unchanged when the differentiated signal is less than the first threshold value and greater than the second threshold value.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a slope detecting receiver provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features. Expressions such as "at least one of," when preceding a list of elements, modify the entire list of elements and do not modify the individual elements of the list. Further, the use of "may" when describing embodiments of the present invention refers to "one or more embodiments of the present invention".

Figure 5:
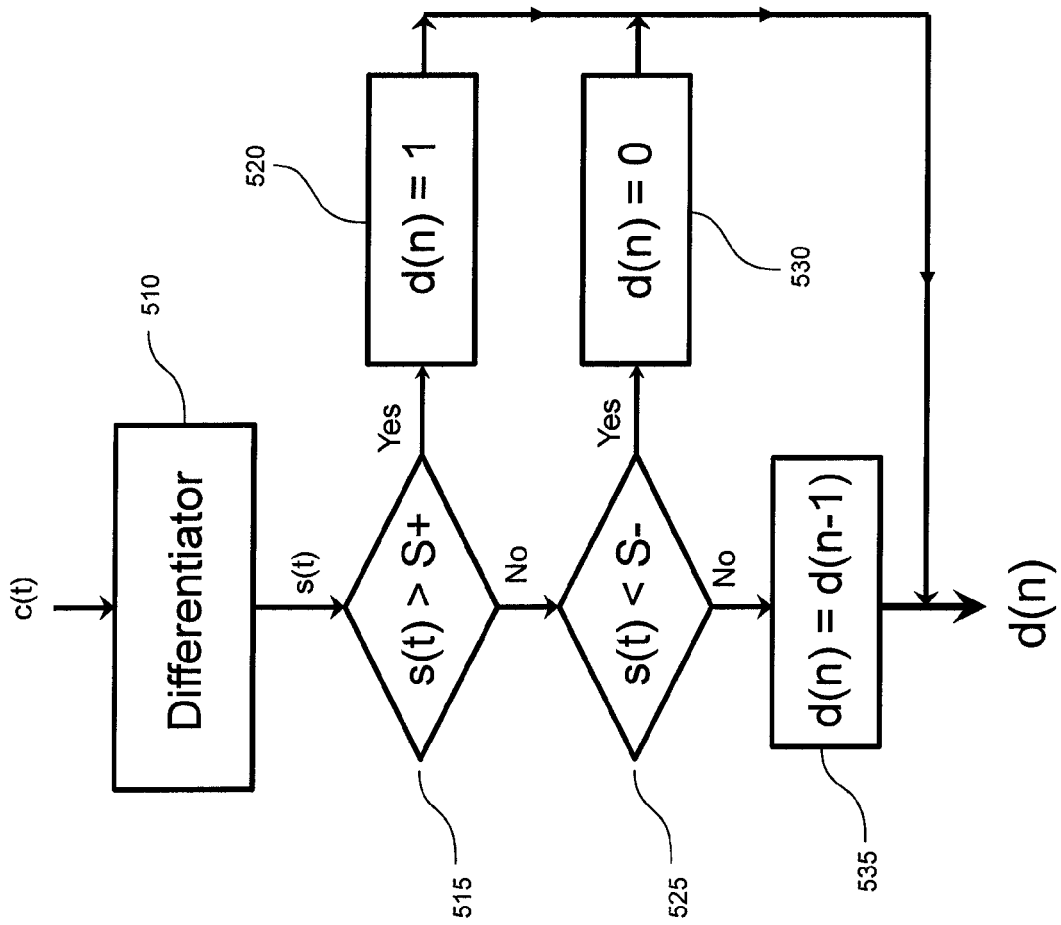
FIG. 5 is a flow chart illustrating a method of operation in a receiver constructed according to an embodiment of the present invention.

Referring to FIG. 5, in a method according to an embodiment of the present invention, the bit value in the digital bit stream is digitized according to the signal's slope rather than the signal's amplitude. The derivative s(t) of the input c(t) from the channel may be formed by a differentiator 510. Subsequently, in an act 515, the derivative may be compared to a first threshold value S+, and if the derivative exceeds the first threshold value, the data value d(n) at the current unit interval may be set, in an act 520, to 1; otherwise the derivative may be compared, in an act 525, to a second threshold value, S−, less than the first threshold value S+. In one embodiment the first threshold value S+ is greater than zero and the second threshold value S− is less than zero. If the derivative is less than the second threshold value, the data value d(n) at the current unit interval may be set, in an act 530, to 0; otherwise, it may be set, in an act 535, to be equal to the data value at the previous unit interval.

Figure 6:
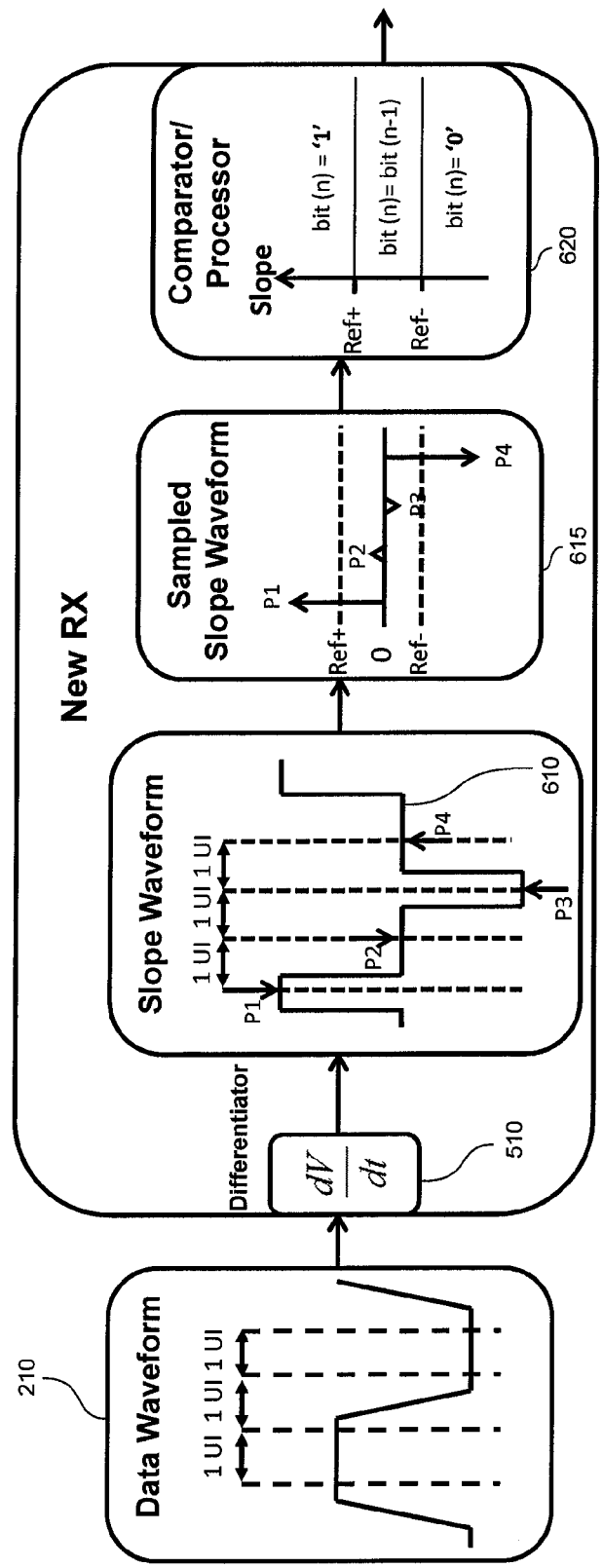
FIG. 6 is a block diagram illustrating processing of a received signal in a receiver constructed according to an embodiment of the present invention.

The process of converting an input to a digital bit stream is further illustrated in FIG. 6, for a well-formed data waveform 210 modulated using NRZ coding with the binary pattern '1100'. Processing by the differentiator 510 results in the slope waveform 610, in which the signal is positive at the point P1, near zero at the points P2 and P4, and negative at the point P3. Sampling the slope waveform 610 results in the sampled slope waveform 615, which again is positive at the point P1, near zero at the points P2 and P4, and negative at the point P3. The output of a comparator/processor 620, the input to which is the sampled slope waveform 615, may be determined according to the method illustrated in FIG. 5, with the first bit being 1, as a result of P1 exceeding the first threshold value, the second bit being 1 (the same as the preceding bit) as a result of P2 falling between the first threshold value and the second threshold value, the third bit being 0 as a result of P3 being less than the second threshold value, the fourth bit being 0 (the same as the preceding bit) as a result of P4 falling between the first threshold value and the second threshold value. Thus, in this example, a system and method according to an embodiment of the present invention faithfully reproduces the bit pattern modulated onto the data waveform 210.

Figure 1:
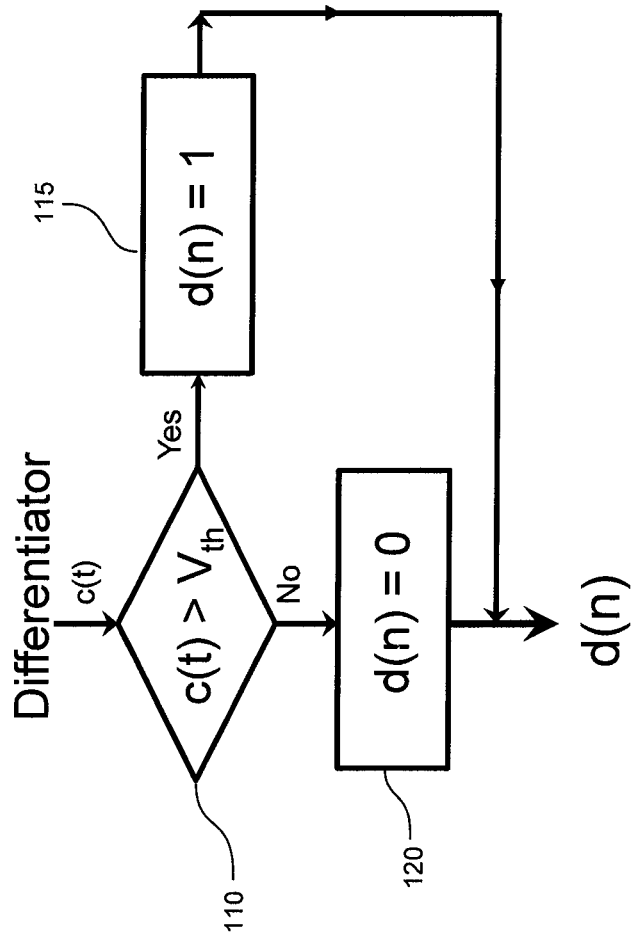
FIG. 1 is a flow chart of a related-art method employed in a receiver.
Figure 2:
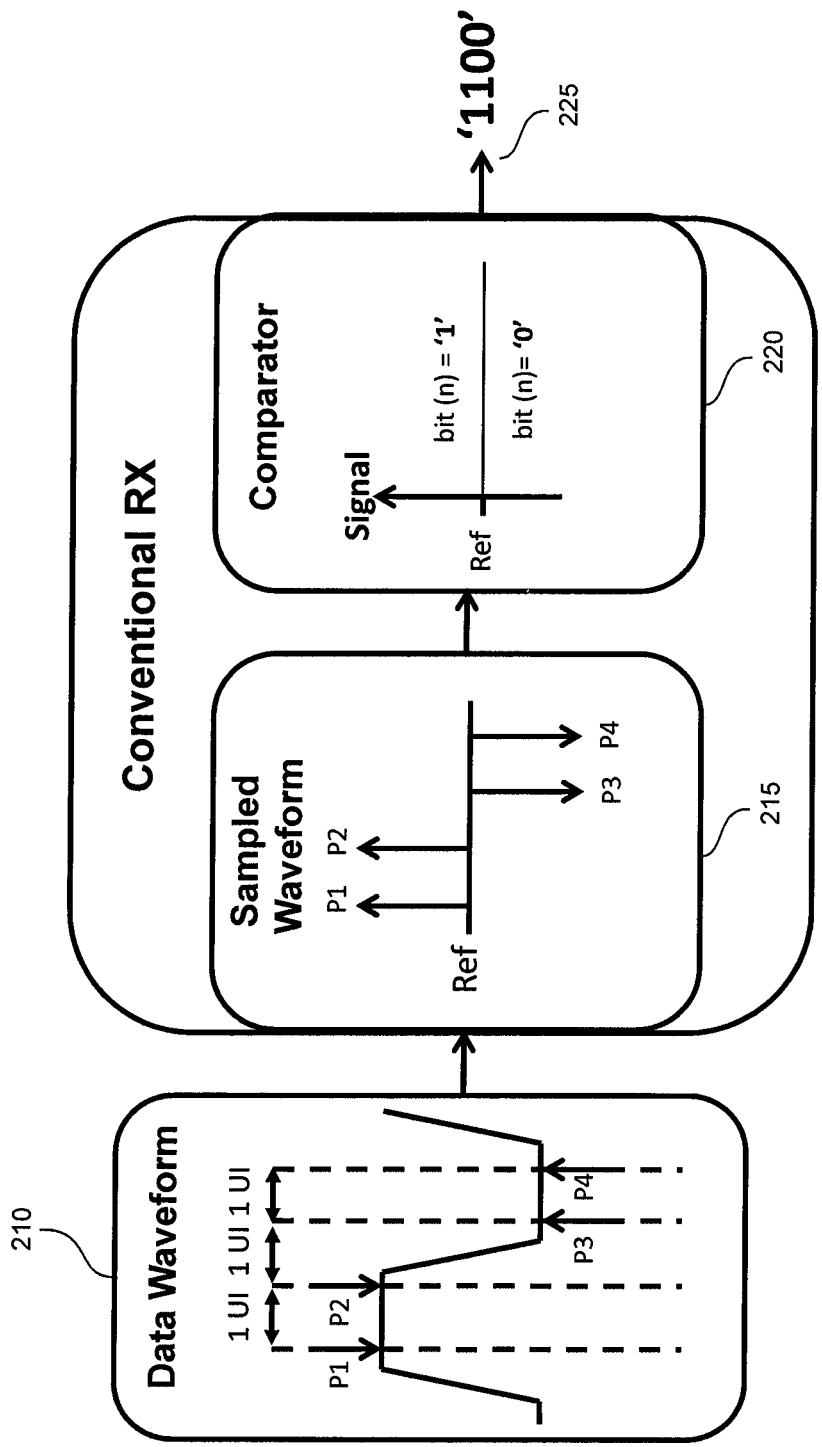
FIG. 2 is a block diagram illustrating processing of a received signal in a related-art receiver.
Figure 3:
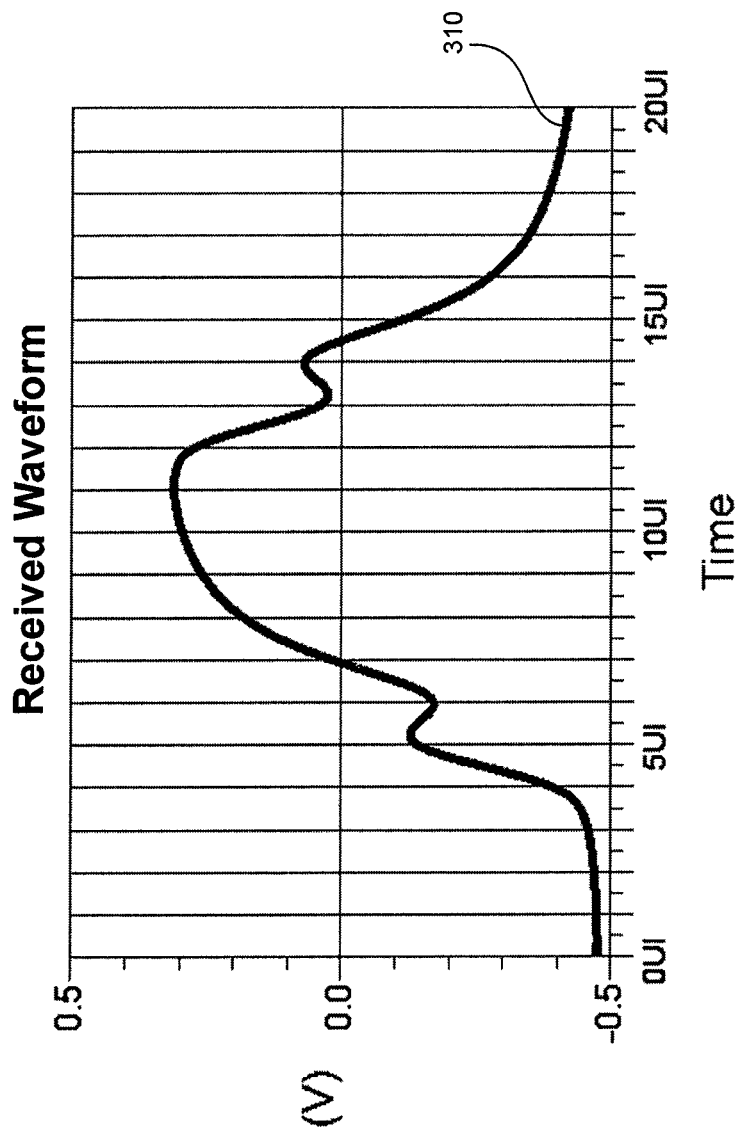
FIG. 3 is a waveform received by a receiver constructed according to an embodiment of the present invention.
Figure 4:
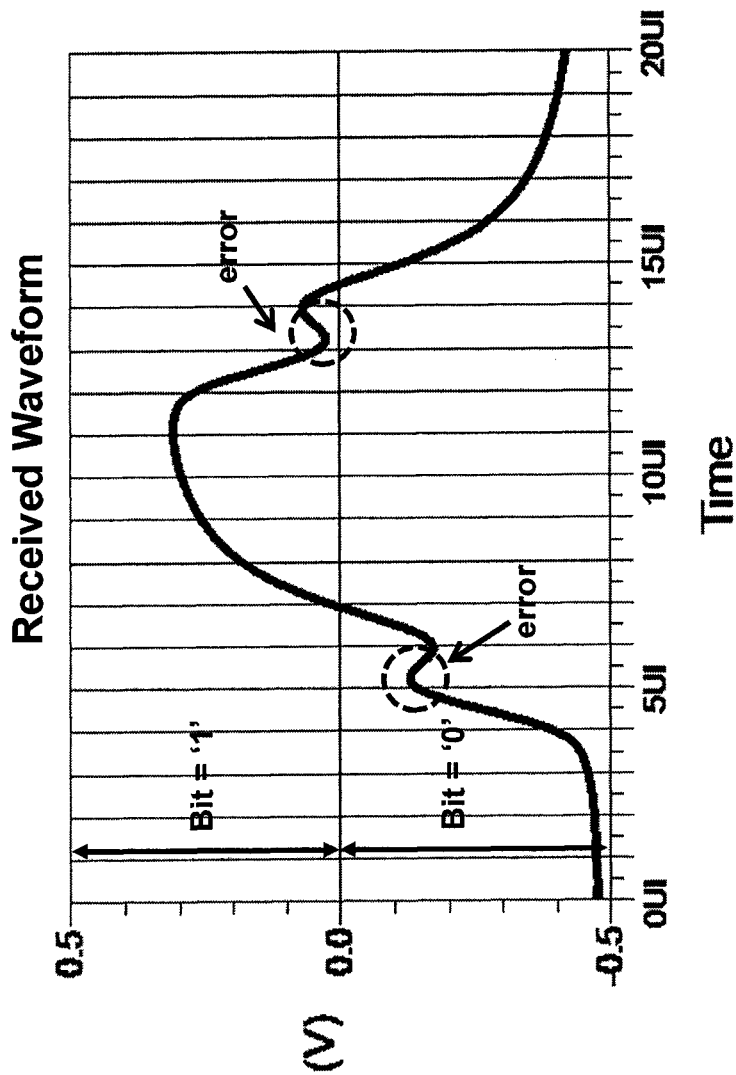
FIG. 4 is a plot of received signal against time illustrating errors in the operation of a related-art receiver.
Figure 7:
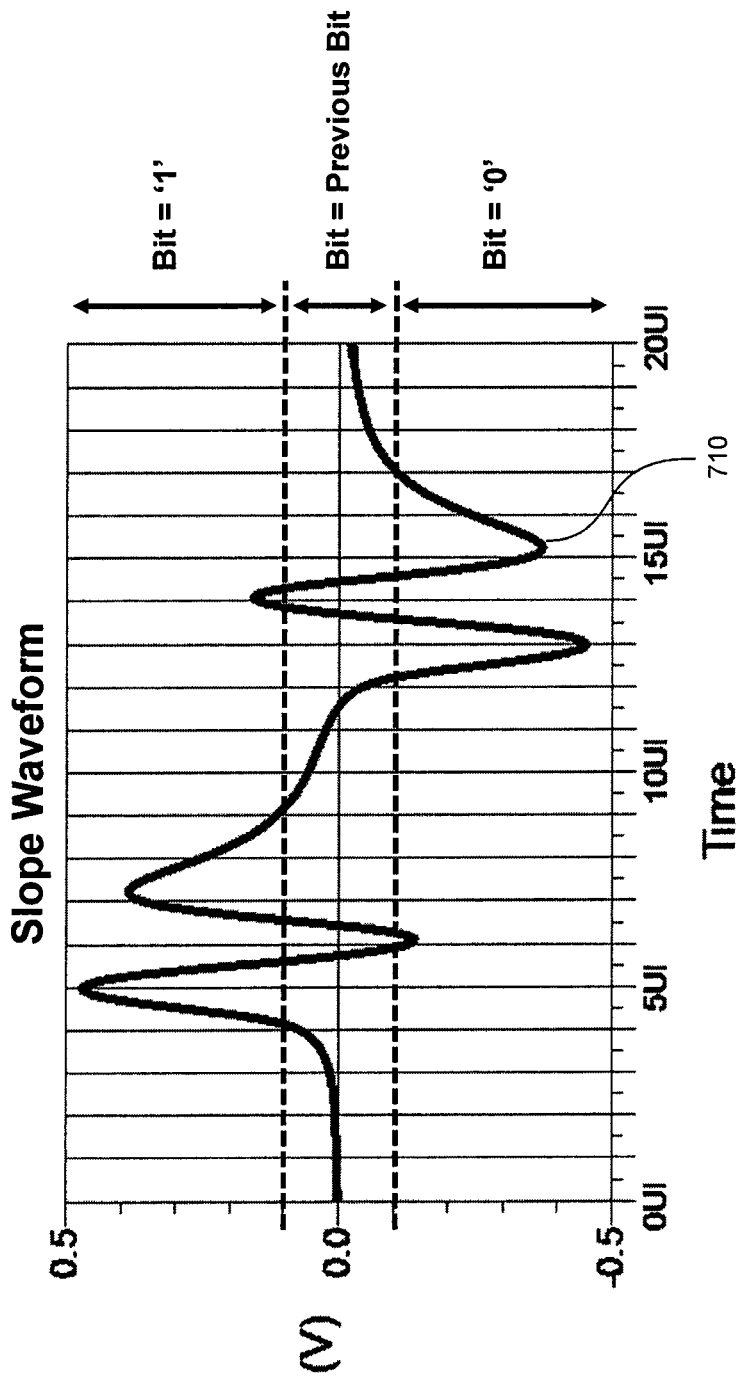
FIG. 7 is a slope waveform formed in a receiver constructed according to an embodiment of the present invention.

Referring to FIG. 7, a system and method according to an embodiment of the present invention also reproduces a modulated waveform when the input to the receiver has been transmitted through a channel producing inter-symbol interference or otherwise distorting the transmitted waveform. The slope waveform 710 illustrated in FIG. 7 may result, for example, from taking the derivative of the received waveform 310 (FIG. 3). The bit stream d(n) produced at the receiver output when the slope waveform 710 is the output of the differentiator 510 (FIGS. 5 and 6) may be seen to be the following. The first three bits may be zero, each being the same as the preceding bit because the slope waveform 710 is initially between the first threshold value S+ and the second threshold value S− for a duration of several UI. At UI number 5, the slope waveform 710 exceeds the first threshold value, resulting in an output of 1, at UI number 6, the slope waveform 710 falls below the second threshold value, resulting in an output of 0, and at UI number 7, the slope waveform 710 again exceeds the first threshold value, resulting in an output of 1. The following five output bits are all 1, because for each corresponding UI the slope waveform 710 is either greater than the first threshold value S+ (for UIs numbered 8 and 9) resulting in an output of 1, or between the two threshold values (for UIs numbered 10 through 12) resulting in the same output as the output at the preceding UI. At UI number 13, the slope waveform 710 falls below the second threshold value, resulting in an output of 0, at UI number 14, the slope waveform 710 exceeds the first threshold value, resulting in an output of 1, and over UIs numbered 15 through 17, the slope waveform 710 falls below the second threshold value, resulting in an output of 0. Thus, the original bit stream '0001011111101000' is reproduced by a portion of the slope waveform 710.

Figure 8:
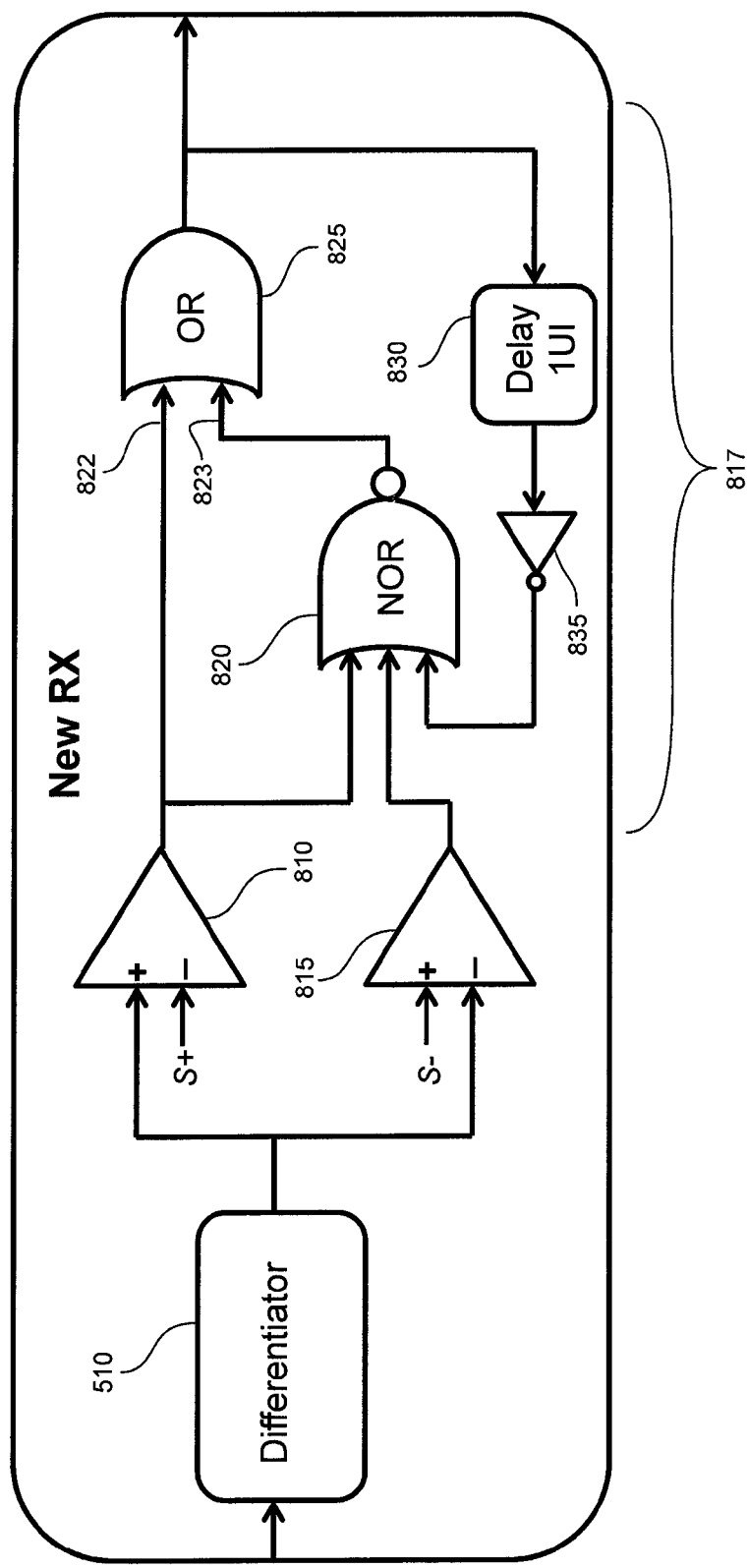
FIG. 8 is a block diagram showing functional elements and logic gates in a receiver constructed according to an embodiment of the present invention.

FIG. 8 shows a differentiator connected to two comparators 810, 815 and a digital circuit (logic circuit) 817, which together are used to implement a system and method according to one embodiment of the present invention. The output of the differentiator and a first threshold value, or reference voltage, S+ are connected to the non-inverting and inverting inputs respectively of the first comparator 810. The output of the differentiator and a second threshold value, or reference voltage, S− are connected to the inverting and non-inverting inputs respectively of the second comparator 815. The outputs of the two comparators 810, 815 are connected to two respective inputs of a 3-input NOR gate 820, i.e., a gate the output of which is low if and only if one or more of its three inputs is high. The output of the first inverter 810 and the output of the three-input NOR gate 820 are connected to the two inputs 822, 823 of an OR gate 825, the output of which is the digital bit stream which forms the output of the receiver. The output of the OR gate 825 is also connected to a one-UI delay 830, the output of which is connected, through an inverter 835 to the third input of the three-input NOR gate 820.

In the digital circuit 817 illustrated in FIG. 8, when the output of the differentiator is between the two threshold values S+ and S−, the outputs of both inverters are low; as a result the output of the three-input NOR gate 820 is the inverse of its third input, which is the inverse of the receiver output one UI previously. Thus in this case the output of the three-input NOR gate 820, which is connected to the second input 823 of the OR gate 825, is equal to the receiver output one UI previously. The output of the first comparator 810 being low, the output of the OR gate 825 is the same as the logic level at its second input 823. In this situation the output of the receiver is thus equal to the receiver output one UI previously.

When the output of the differentiator exceeds the first threshold value S+, the output of the first comparator is high, causing the first input 822 of the OR gate 825 to be high, which causes the output of the circuit to be high. When the output of the differentiator is less than the second threshold value S−, the output of the second comparator is high; this causes the output of the three-input NOR gate 820 to be low, and, because when the output of the differentiator is less than the second threshold value S−, is it also less than the first threshold value S+, the output of the first comparator 810 is also low. Thus both inputs 822, 823 to the OR gate 825 are low, and the receiver output is low.

The receiver illustrated in FIG. 8 thus exhibits the behavior illustrated in FIG. 5: when the output of the differentiator 510 is greater than the first threshold value S+, the receiver output is 1, when the output of the differentiator 510 is less than the second threshold value S−, the receiver output is 0, and when the output of the differentiator 510 is between the first threshold value S+ and the second threshold value S−, the receiver output is the same as it was one UI previously.

Figure 9:
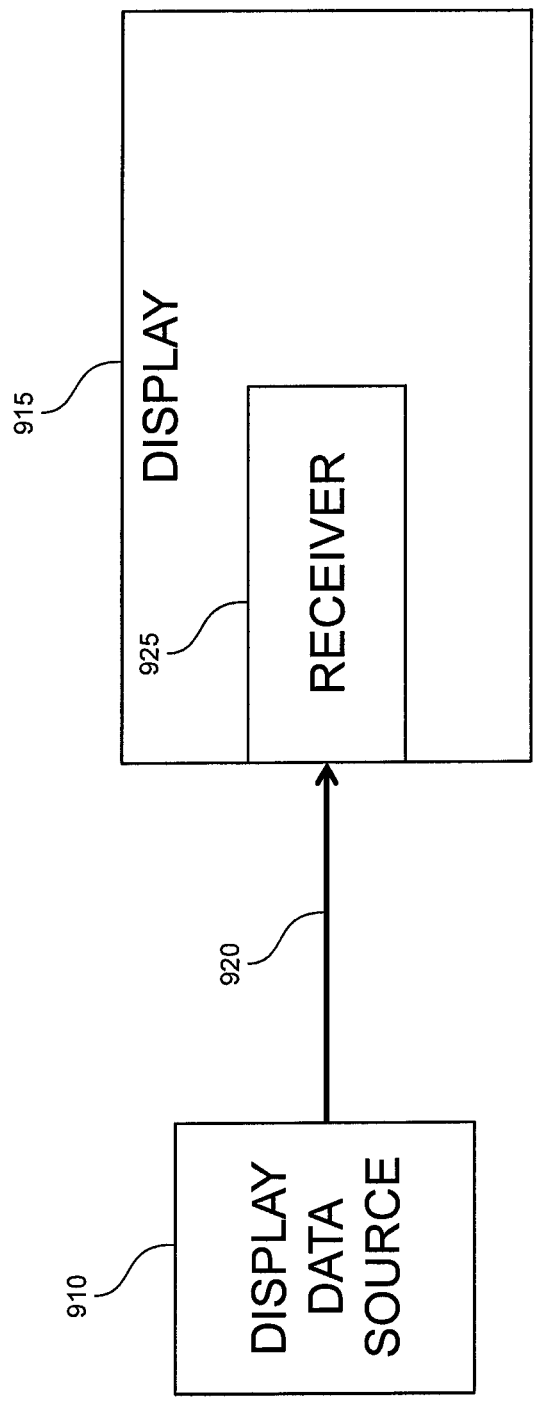
FIG. 9 is a block diagram of a digital communication link configured to transmit data to a display according to an embodiment of the present invention.

FIG. 9 shows an exemplary application of a receiver constructed according to an embodiment of the present invention. A source 910 of data for displaying on the display 915 is transmits digital data over the channel 920 to the receiver 925 inside the display 915. The receiver 925 receives the data, and the display 915 generates a corresponding display of information for a user to view.

The digital circuit may be implemented with logic gates as illustrated in FIG. 8, or with any other embodiment of a processing unit. The term "processing unit" is used herein to include any combination of hardware, firmware, and software, employed to process data or digital signals. Processing unit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs).

Although limited embodiments of a slope detecting receiver have been specifically described and illustrated herein, many modifications and variations will be apparent to those skilled in the art. Accordingly, it is to be understood that the slope detecting receiver employed according to principles of this invention may be embodied other than as specifically described herein. The invention is also defined in the following claims, and equivalents thereof.

What is claimed is:

1. A receiver for generating a binary data stream from a modulated analog signal, the receiver comprising:
   a differentiator;
   a first comparator;
   a second comparator; and
   a digital circuit,
   an input of the differentiator configured to receive the analog signal,
   an output of the differentiator connected to a non-inverting input of the first comparator,
   an inverting input of the first comparator configured to receive a first threshold value,
   the output of the differentiator connected to an inverting input of the second comparator,
   a non-inverting input of the second comparator configured to receive a second threshold value,
   an output of each of the first and second comparators connected to an input of the digital circuit, and
   the digital circuit configured to generate the binary data stream,
   wherein the digital circuit comprises:
      a three-input NOR gate, comprising a first input, a second input, a third input, and an output;
      a two-input OR gate, comprising a first input, a second input, and an output;
      a delay block comprising an input and an output, configured to introduce a signal delay of one unit interval; and
      an inverter comprising an input and an output;
   the output of the first comparator being connected to the first input of the three-input NOR gate and to the first input of the two-input OR gate,
   the output of the second comparator being connected to the second input of the three-input NOR gate,
   the output of the three-input NOR gate being connected to the second input of the two-input OR gate,
   the output of the two-input OR gate being connected to the input of the delay block,
   the output of the delay block being connected to the input of the inverter, the output of the inverter being connected to the third input of the three-input NOR gate, and the output of the two-input OR gate being connected to the output of the digital circuit.

2. The receiver of claim 1, wherein:
the first threshold value is greater than zero; and
the second threshold value is less than zero.

3. The receiver of claim 2, wherein the digital circuit is configured to output:
a value of 1 when the output of the first comparator is 1;
a value of 0 when the value of the second comparator is 1; and
an unchanging value otherwise.

4. A method of generating, in a receiver, a binary data stream from a modulated analog signal, the method comprising:
differentiating the analog signal to form a differentiated signal;
comparing the differentiated signal to a first threshold value;
comparing the differentiated signal to a second threshold value;
forming a binary output of 1 at an output of the receiver when the differentiated signal exceeds the first threshold value;
forming a binary output of 0 at the output of the receiver when the differentiated signal is less than the second threshold value; and
leaving the binary output unchanged when the differentiated signal is less than the first threshold value and greater than the second threshold value,
wherein the receiver comprises a first comparator, a second comparator, and a digital circuit comprising:
a three-input NOR gate, comprising a first input, a second input, a third input, and an output;
a two-input OR gate, comprising a first input, a second input, and an output;
a delay block comprising an input and an output, configured to introduce a signal delay of one unit interval; and
an inverter comprising an input and an output;
the output of the first comparator being connected to the first input of the three-input NOR gate and to the first input of the two-input OR gate,
the output of the second comparator being connected to the second input of the three-input NOR gate,
the output of the three-input NOR gate being connected to the second input of the two-input OR gate,
the output of the two-input OR gate being connected to the input of the delay block,
the output of the delay block being connected to the input of the inverter,
the output of the inverter being connected to the third input of the three-input NOR gate, and
the output of the two-input OR gate being connected to the output of the digital circuit.

5. The method of claim 4, wherein the acts of:
forming a binary output of 1 at an output of the receiver when the differentiated signal exceeds the first threshold value;
forming a binary output of 0 at the output of the receiver when the differentiated signal is less than the second threshold value; and
leaving the binary output unchanged when the differentiated signal is less than the first threshold value and greater than the second threshold value
comprise:
comparing the differentiated signal to the first threshold value in a first comparator, to form a first binary result which takes the value 1 when the differentiated signal exceeds the first threshold value and which takes the value 0 when the differentiated signal is less than the first threshold value;
comparing the differentiated signal to the second threshold value in a second comparator, to form a second binary result which takes the value 1 when the differentiated signal is less than the second threshold value and which takes the value 0 when the differentiated signal exceeds the second threshold value;
combining the first binary result, the second binary result, and a third binary result in the three-input NOR gate to form a fourth binary result;
combining the fourth binary result and the first binary result in a two-input OR gate to form a fifth binary result;
delaying the fifth binary result by a unit interval and inverting it to form the third binary result; and
providing the fifth binary result at the output of the receiver.

6. A system for generating, in a receiver, a binary data stream from a modulated analog signal, the system comprising:
means for differentiating the analog signal to form a differentiated signal;
means for comparing the differentiated signal to a first threshold value;
means for comparing the differentiated signal to a second threshold value;
a first comparator;
a second comparator; and
a digital circuit,
wherein the digital circuit comprises:
a three-input NOR gate, comprising a first input, a second input, a third input, and an output;
a two-input OR gate, comprising a first input, a second input, and an output;
a delay block comprising an input and an output, configured to introduce a signal delay of one unit interval; and
an inverter comprising an input and an output;
the output of the first comparator being connected to the first input of the three-input NOR gate and to the first input of the two-input OR gate,
the output of the second comparator being connected to the second input of the three-input NOR gate,
the output of the three-input NOR gate being connected to the second input of the two-input OR gate,
the output of the two-input OR gate being connected to the input of the delay block,
the output of the delay block being connected to the input of the inverter,
the output of the inverter being connected to the third input of the three-input NOR gate, and
the output of the two-input OR gate being connected to the output of the digital circuit.

* * * * *